United States Patent [19]

Misumi et al.

[11] Patent Number: 4,565,924

[45] Date of Patent: Jan. 21, 1986

[54] LIGHT SIGNAL BINARY DEVICE WITH OPTICAL FEEDBACK

[75] Inventors: Haruo Misumi; Hiroshi Ogawa, both of Joyo; Naotake Nagao, Muko; Katsuhiko Oimura, Osaka, all of Japan

[73] Assignee: Omron Tateisi Electronics Co., Kyoto, Japan

[21] Appl. No.: 472,244

[22] Filed: Mar. 4, 1983

[30] Foreign Application Priority Data

Mar. 5, 1982 [JP] Japan .................. 57-34794
Mar. 31, 1982 [JP] Japan .............. 57-47192[U]
Mar. 31, 1982 [JP] Japan .............. 57-47193[U]
Mar. 31, 1982 [JP] Japan .............. 57-47194[U]

[51] Int. Cl.[4] ............................................. H01L 31/14
[52] U.S. Cl. ........................... 250/227; 250/551; 455/601
[58] Field of Search ............. 250/227, 551, 214 R, 250/214 SW, 211 J, 211 R, 205; 307/311; 357/19; 350/96.1, 96.15, 96.17; 455/601

[56] References Cited

U.S. PATENT DOCUMENTS

| | | | |
|---|---|---|---|
| 3,462,606 | 8/1969 | Case ........................ | 250/551 |
| 3,524,986 | 8/1970 | Harden, Jr. ............... | 250/214 R |
| 4,074,143 | 2/1978 | Rokos ...................... | 357/19 |
| 4,124,860 | 11/1978 | Johnson ................... | 357/19 |

Primary Examiner—Edward P. Westin
Attorney, Agent, or Firm—Cushman, Darby & Cushman

[57] ABSTRACT

An input light signal is guided to a light receiving element by an input optical fiber, and converted into an electric signal. This electric signal is converted again into an optical signal by a light emitting element, and this optical signal is optically and positively fed back to the light receiving element by a partially reflecting film between the light emitting element and an output optical fiber. In this way, the input optical signal can be electrically or optically converted in a two-valued state at the output side of the light receiving element or light emitting element.

5 Claims, 31 Drawing Figures (A)

(B)

(A)
(B)

FIG. 15
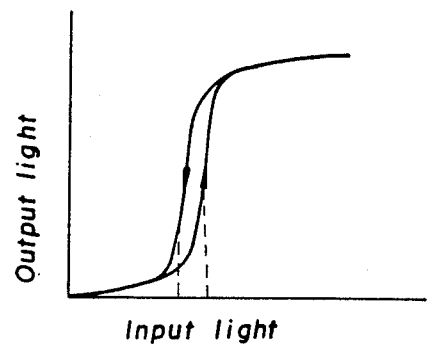
FIG. 16
(A)
FIG. 16
(B)
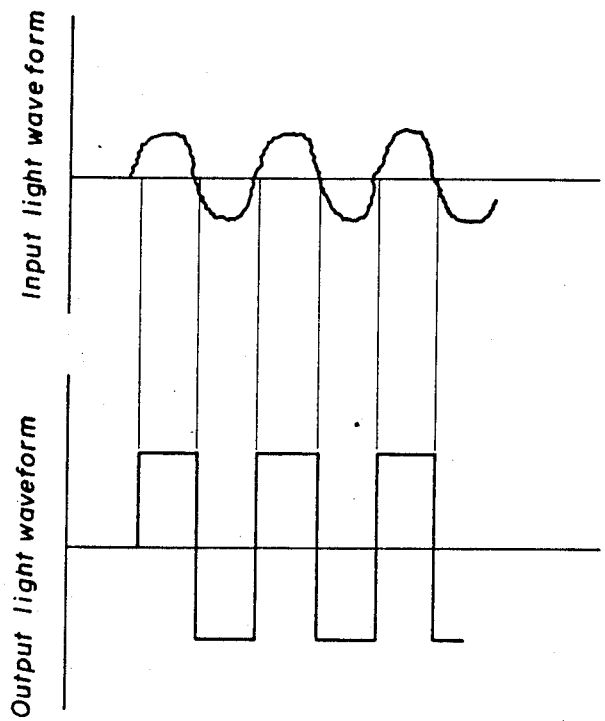

(A)

(B)

FIG. 21
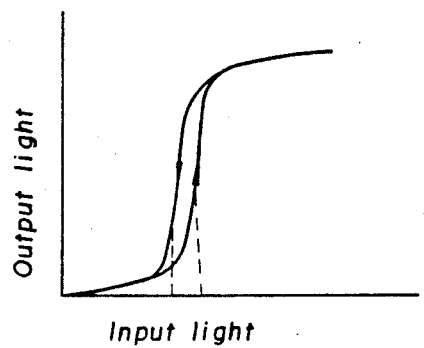
FIG. 22
(A)
FIG. 22
(B)
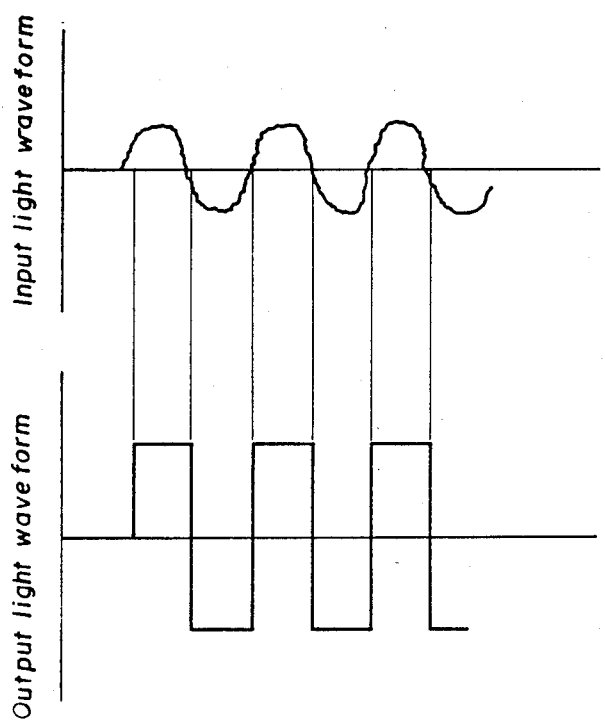

LIGHT SIGNAL BINARY DEVICE WITH OPTICAL FEEDBACK

BACKGROUND OF THE INVENTION

The present invention relates to a light signal binary device capable of high speed operation and suitable as a light level detector or light relay in optical fiber transmission.

Conventionally, to convert an analog light signal into an electric signal by the binary method, the analog light signal is converted into an analog electric signal by a photoelectric converter element and the obtained analog electric signal is binary processed by an amplifier circuit having a prescribed positive feedback loop. However, if such method is applied to a light level detector, the delay time of the binary amplifier circuit in addition to the delay time of the photoelectric converter element causes a slow response.

Conventionally, when an input digital light signal of poor waveform is converted into an output light signal of correct square waveform by a light relay, the input light signal is detected by a light receiving element and converted into an electric signal, and then the electric signal is electrically shaped and converted into a light signal by a light emitting element to finally obtain the output light signal. However, even by this method, a complicated electrical circuit is necessary between the light emitting element and the light receiving element. Thus, the delay time of the electrical circuit is added to the delay time of the light emitting element and light receiving element, and the phase delay between the input light signal and output light signal is increased.

BRIEF SUMMARY OF THE INVENTION

An object of this invention is a light signal binary device capable of a high response speed between input and output signals in converting an analog light signal into an electric signal by the binary method.

Another object of this invention is a light signal binary device capable of reducing phase delay of input and output light signals and performing high speed transmission when an input digital light signal of poor waveform is converted into an output light signal of correct waveform by an optical relay.

A further object of this invention is a light signal binary device of simple construction further capable of miniaturization and manufacture at low cost.

Other and further objects of this invention will become obvious upon an understanding of the illustrative embodiments about to be described or will be indicated in the appended claims, and various advantages not referred to herein will occur to one skilled in the art upon employment of the invention in practice.

BRIEF DESCRIPTION OF THE DRAWINGS

FIG. 15 is a curve for threshold level and hysteresis characteristics of said light relay of FIG. 11.

FIGS. 16(A), (B) are diagrams respectively for the input light waveform and received light output waveform in said light relay of FIG. 11.

FIG. 21 is a curve for threshold level and hysteresis characteristics of said light relay of FIG. 17.

FIGS. 22(A), (B) are diagrams respectively for light input waveform and received light output waveform in said light relay of FIG. 17.

DETAILED DESCRIPTION OF THE INVENTION

Figure 1:
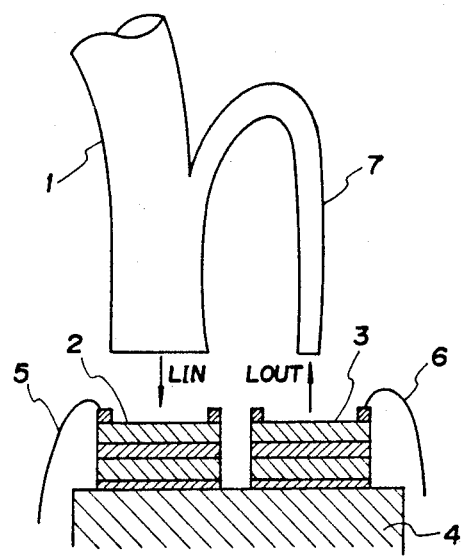
FIG. 1 is a view showing in a first embodiment the relative arrangement of an optical fiber and light emitting and receiving elements in a light level detector.

Now referring to the drawings, in FIG. 1, the numeral 1 is an optical fiber for transmitting an input light signal, for instance, an optical fiber of bundle type, the numeral 2 is a light receiving element, for instance, an NPN phototransistor, the numeral 3 is a light emitting element, for instance, a light emitting diode, and these are provided on a same stem 4 as a hybrid elements. The numeral 5, 6 are bonding wires. The numeral 7 is a branch part coupled to said optical fiber 1 to constitute a feedback causing output light from the light emitting diode 3 to be incident on the optical fiber 1. In short, input light LIN from the optical fiber 1 is incident on phototransistor 2, while emitted light LOUT from the light emitting diode 3 is incident on the branch part 7 of the optical fiber 1.

Figure 2:
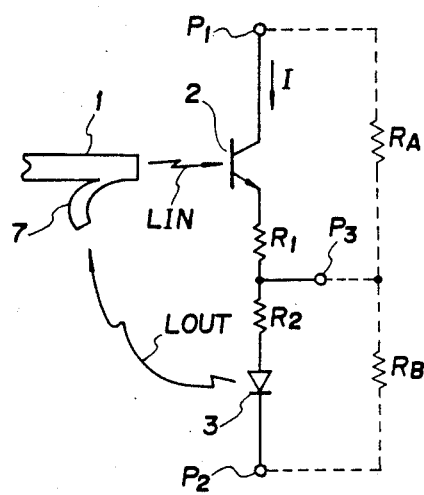
FIG. 2 is an equivalent circuit diagram of said light level detector.

An equivalent circuit of this level detector is shown in FIG. 2. Operation will now be described.

Figure 3:
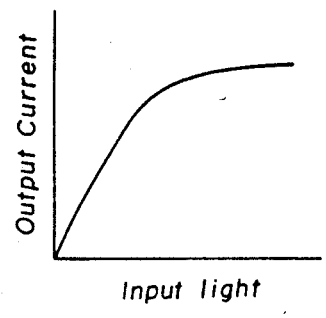
FIGS. 3(A), (B) are characteristic curves respectively for the light receiving element and the light emitting element of said light level detector.
Figure 3:
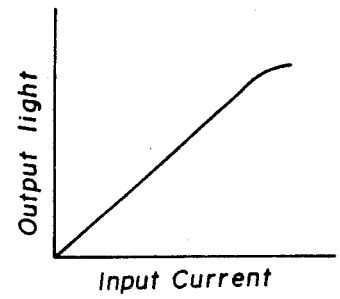
Figure 4:
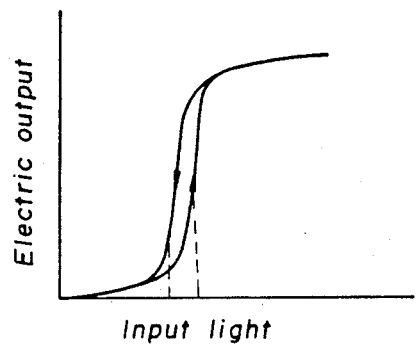
FIG. 4 shows curves for threshold level and hysteresis characteristics of said light level detector.

A driving voltage is applied between terminals $P_1-P_2$, and external resistors $R_A$, $R_B$ of a certain value are connected respectively between terminals $P_1-P_2$ and $P_3-P_2$, while resistors $R_1$, $R_2$ are connected respectively between an emitter of the phototransistor 2 and the terminal $P_3$ and the terminal $P_3$ and an anode of the light emitting diode 3. The input light-output current of the phototransistor 2 and the input current-output light of the light emitting diode 3 in this embodiment are as shown respectively in FIG. 3(A) and FIG. 3(B). If each resistance value of said resistors $R_A$, $R_B$ is set to a suitable value, the relation of received light output (electrical output) of the phototransistor 2 to input light of the optical fiber has been experimentally proven to provide threshold level and hysteresis characteristics as shown in FIG. 4.

Firstly for the phototransistor 2, if light from the optical fiber 1 is incident, output current 1 increases with light amplitude. If the output current I increases, the light from light emitting diode 3 is increased, and this output light is incident on the branch part 7 of the optical fiber 1 and again incident on light receiving element 2.

In this way, a positive feedback loop rapidly increases output light of the light emitting diode 3. The opposite occurs when the input light decreases. However, output light from the light emitting diode 3 has been already partially incident on phototransistor 2 through branch part 7 and the optical fiber 1, so that, when the incident light transmitted by optical fiber decreases, rapid reduction of output light of the light emitting diode 3 occurs at a value less than in the case of increase, i.e. hysteresis results.

Figure 5:
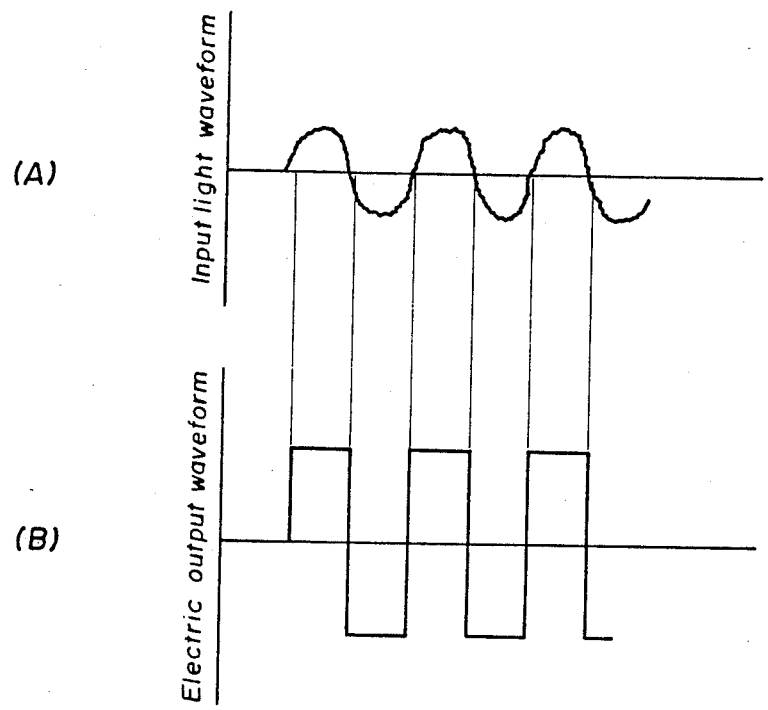
FIGS. 5(A), (B) are diagrams respectively for input light waveform and received light electric output waveform of said light level detector.

The input light waveform and received light electrical output waveform are as shown in FIG. 5. As understood from the FIG., in this light level detector, light amplification can be performed by fewer circuit parts and simultaneously delay dependent on response speed of both of the phototransistor 2 and the light emitting diode 3 minimized. The detector can be used at a high frequency and can shape the waveform, especially with the threshold level characteristic and hysteresis characteristic.

Although in the above embodiment, a phototransistor is used as the light receiving element 2, another element such as a photodiode or the like can be used. Further a laser diode or the like in addition to the light emitting diode can be used as the light emitting element 3.

Figure 6:
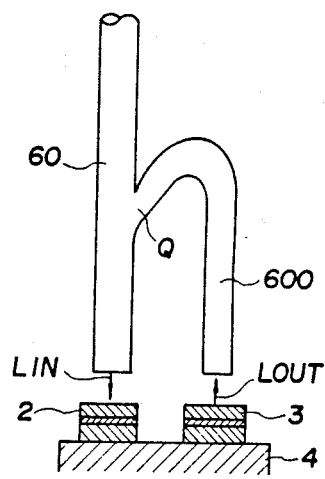
FIG. 6 is a view explaining the first embodiment with a branch optical fiber in said light level detector.

Further, in the above embodiment, a bundle type optical fiber can be used for ease in forming a branch. As shown, for instance, in FIG. 6, however, a branch fiber 600 is welded to point Q of an optical fiber 60, and an optical level detector used as above. Needless to say, optical feedback can be used with a bundle type optical fiber, and is not limited to a welded branch type, and an optical element such as a mirror, prism, lens, etc. can be used. As described above, the first embodiment provides only a positive feedback of light from the light emitting element to the light receiving element.

Figure 7:
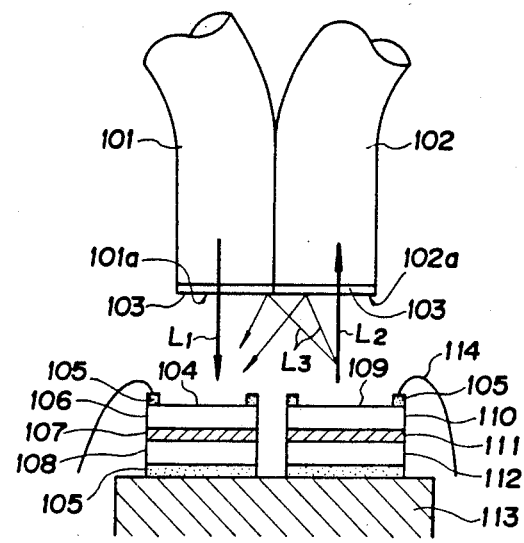
FIG. 7 is a sectional view of a second embodiment of this invention.

FIG. 7 is a sectional view showing the second embodiment of this invention in which input light L1 from an input optical fiber 101 is incident on a light receiving element 104 (here, a high speed phototransistor), provided at a face-to-face position to an end face 101a of the optical fiber 101, while most of the light L2 from a slight emitting element 109 (here, LED) is introduced to an output optical fiber 102 and hence to the outside.

However, part L3 of the output light of the light emitting element 109 is reflected by a semi-transparent reflecting film 103, applied as a coating on the end faces 101a, 102a of the two optical fibers 101 and 102. An output terminal (here, emitter) of the light receiving element 104 and an input terminal (here, anode) of the light emitting element 102 are electrically connected by a stem 113. In consequence, the light emitting element 109 can be directly driven by a light current from the light receiving element 104. Further, the number 105 is an electrode, 106 is an N-type semiconductor, constituting a phototransistor, 107 is a P-type semiconductor, constituting a phototransistor, 108 is an N-type semiconductor, constituting a phototransistor, 110 is an N-type semiconductor, constituting an LED, 111 is an N-type semiconductor, constituting an LED, 112 is a P-type semiconductor, constituting an LED, and 114 is a bonding wire.

Figure 8:
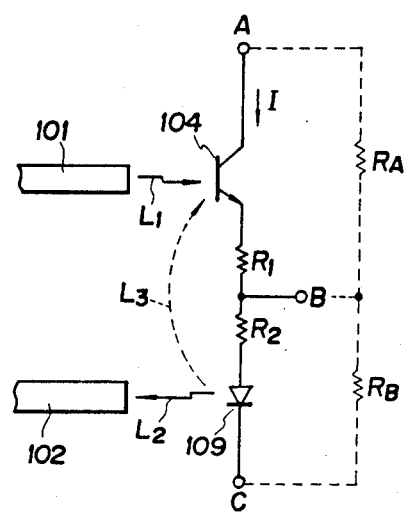
FIG. 8 is a view showing an electrical equivalent circuit of said light relay of FIG. 7.

An electric equivalent circuit of this light relay is as shown in FIG. 8. Operation of this relay will be described on the basis of this circuit.

DC voltage is applied across terminals A-C, while prescribed external resistors $R_A$, $R_B$ are connected between terminals A-B and B-C. In addition, here the external resistors $R_A$, $R_B$ are used for determining the working point in this circuit, and the values of these resistors are suitably selected. An input light-output current characteristic of the light receiving element 104 and an input current-output light characteristic of the light emitting element 109 in this embodiment are shown respectively in FIG. 9(A) and FIG. 9(B).

In the above circuit, incident light L1 to the light receiving element 104 from the optical fiber 101 causes collector current I to increase. This increase in current I increases the quantity of light emitted from the light emitting element 109, and a part L3 of this output light is reflected by a reflecting film 103 applied as a coating on the optical fibers 101 and 102 and again incident on light receiving element 104. In this way, a positive feedback loop rapidly increases output light of the light emitting element 109, resulting in a threshold level characteristic.

Figure 9:
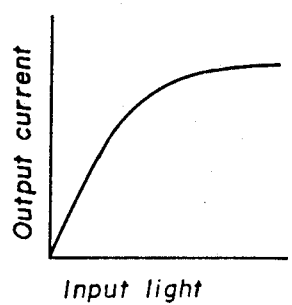
FIG. 9(A) is a graphic curve showing a characteristic of the light receiving element of said light relay of FIG. 7.
FIG. 9(B) is a graphic curve showing a characteristic of the light emitting element in said light relay of FIG. 7.
FIG. 9(C) is a graphic curve showing a hysteresis characteristic between input and output in said light relay of FIG. 7.
Figure 9:
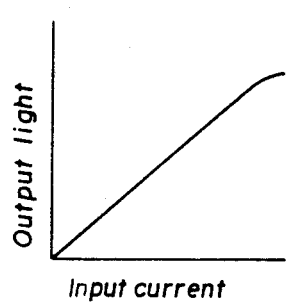
Figure 9:
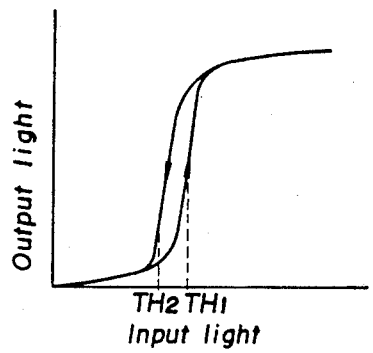
Figure 10:
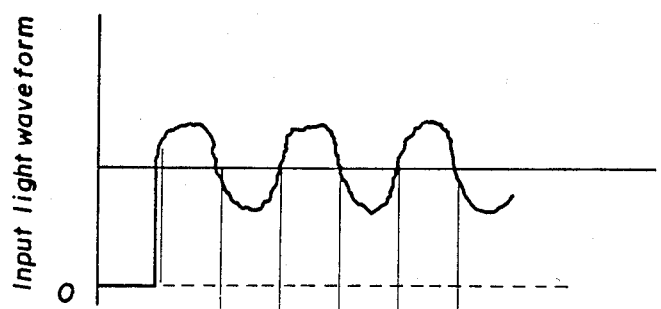
FIGS. 10(A), (B) are graphic curves showing the relation between the input light waveform and output light waveform in said light relay of FIG. 7.
Figure 10:
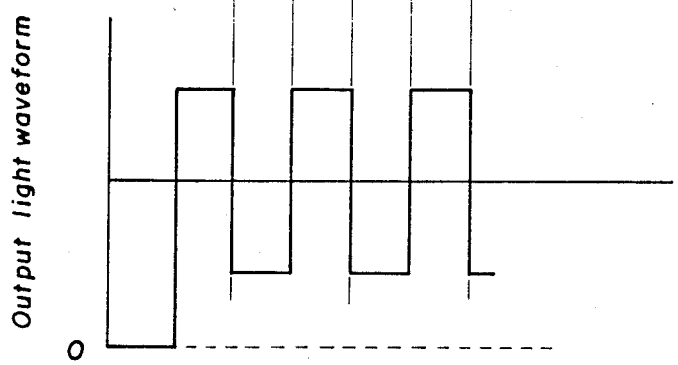

The reverse happens when the incident light beam from the optical fiber 101 decreases. The threshold level for output light of the light emitting element 104 rapidly decreases when incident light of the optical fiber 101 decreases. This occurs at a magnitude of incident light slightly less than in the case of increase. In consequence, a hysteresis characteristic can be obtained as shown in FIG. 9(C).

In the light relay of the second embodiment, amplification of light can be performed by a few circuit parts. Simultaneously delay depends only upon the response speed of each of the light emitting and receiving element. This decreases phase delay between input and output signals and enables use at relatively high frequency. Further, excellent shaping waveform results. In this embodiment, a phototransistor is used as a light receiving element. Needless to say, any other light receiving element can be used. Likewise a laser diode or the like can be used as the light emitting element. Further, the light relay in the second embodiment can be used as an optical sensor or optical comparator or the like, and put to other various kinds of use.

Figure 11:
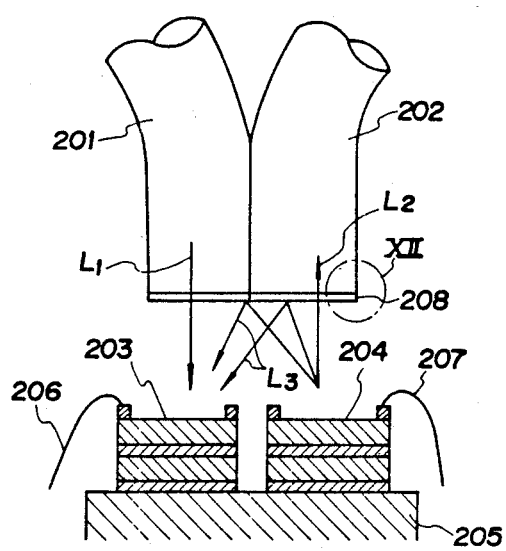
FIG. 11 is a view showing a third embodiment of this invention.
Figure 12:
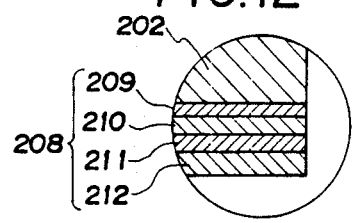
FIG. 12 is a sectional view enlarged with a portion XII in FIG. 11.

FIG. 11 shows an example of a third embodiment of this invention. In the Fig., the numerals 201, 202 are a pair of optical fibers, with one optical fiber 201 for input light and the other optical fiber 202 for output light. The numeral 203 is a light receiving element, for instance, a NPN phototransistor, and the numeral 204 is a light emitting element, for instance, a light emitting diode. These are mounted adjacent on the same stem 205 as a hybrid element. The numerals 206, 207 are bonding wires. A polarizing film 208, reflecting light with a plane of polarization not utilized for light transmission to the light receiving element 203, is coated on an end face of said optical fibers 201, 202. This polarizing film 208 is as shown in, for instance, FIG. 12, laminated with a ZnS layer 209, cryolite layer 210 and ZnS layer 211 from the end face side of the optical fiber 202 to a glass layer 212. In short a polarizing multi-layer film is used.

Input light L1 from the light input-polarization plane-reserved optical fiber 201 passes through the polarizing multi-layer film 208 and is incident to the phototransistor 3. At this time, the plane of polarization of the input light L1 optically transmitted and the plane of polarization permeated by the polarizing multi-layer film 208 are aligned. Attenuation of light due to this positioning multi-film 208 is slight and can be neglected. The light L2 emitted from the light emitting diode 204 has a plane of polarization utilized for light transmission, similarly passes through the polarizing multi-layer film 208 with only a slight amount of attenuation and is combined in the light output-polarization plane-holding optical fiber 202 and transmitted. Light L3, with a plane of polarization not required for light transmission, is reflected by the polarizing multi-layer film 208 and incident to the phototransistor 203. That is, positive feedback of light is produced by the above reflected light. The result is a level converter with a threshold level characteristic of light level conversion and improved response speed. Thus the light with a plane of polarization not required for light transmission is used as optical power for positive feedback to decrease transmission optical power as little as possible.

Figure 13:
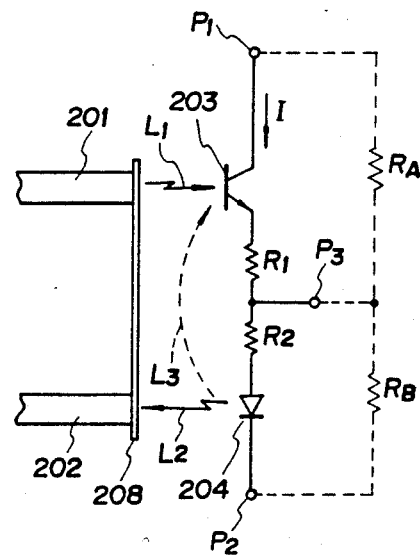
FIG. 13 is an equivalent circuit diagram of said light relay of FIG. 11.

An equivalent circuit of the above is as shown in FIG. 13. Operation of the above will be described on the basis of this circuit.

Figure 14:
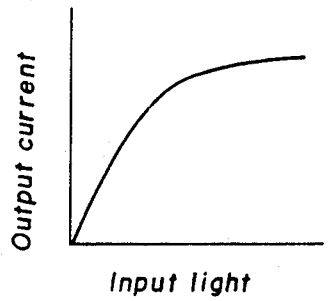
FIGS. 14(A), (B) are characteristic curves respectively for the light receiving element and light emitting element.
Figure 14:
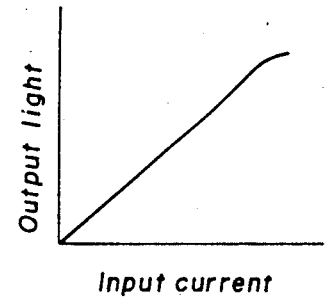

Driving voltage is applied between terminals $P_1$-$P_2$, and external resistors $R_A$, $R_B$ with a certain value are connected respectively between terminals $P_1$-$P_3$ and terminals $P_3$-$P_2$. Further resistors $R_1$, $R_2$ are connected respectively between the terminal $P_3$ and emitter of phototransistor 203 and the terminal $P_3$ and anode of light emitting diode 204. The input light-output current characteristic of the phototransistor 203 and the input current-output light characteristic of the light emitting diode 204 in this embodiment are as shown respectively in FIG. 14(A) and FIG. 14(B). If the resistance values of said resistors $R_A$, $R_B$ are set to a suitable value, the relation of output light of the optical fiber 202 to input light of the optical fiber 201 has been experimentally proven to provide threshold level and hysteresis characteristics as shown in FIG. 15.

Firstly, as light incident from the optical fiber 201 increases, output current I increases in accordance therewith. The increase of the output current I increases output of light emitting diode 204, and this output light is partially reflected by the polarizing multi-layer film 208 in the end face of the optical fiber 202, and again incident on the phototransistor 203. In this way, a positive feedback loop rapidly increases output light of the light emitting diode 204, that is, a threshold level characteristic results. The opposite occurs when input light decreases. As above, a hysteresis characteristic results.

FIG. 16 shows light input waveform and light output waveform in optical fiber transmission used with the above. As understood from this Fig., also in the third embodiment, amplification of light can be performed by a small number of circuit parts. Simultaneously a delay depends only on the response speed of both elements of the phototransistor 203 and the light emitting diode 204.

Now in the above embodiment, the thin film of ZnS-cryolite-ZnS for the polarizing film 208 is preferably formed by evaporation. However, glass reflection can be utilized. Further the polarizing film 208 is only required to be provided on one side of the optical fiber 202, and the polarizing multi-layer film 208 filmed to the end face of the light input optical fiber 201 can be eliminated. Further in the above embodiment, though a phototransistor is used as the light receiving element 203, another element may be used, while as the light emitting element 204, a laser diode can be used.

As described, the third embodiment can increase the response speed as an optical level converter having a threshold level characteristic without causing a loss of optical power.

Figure 17:
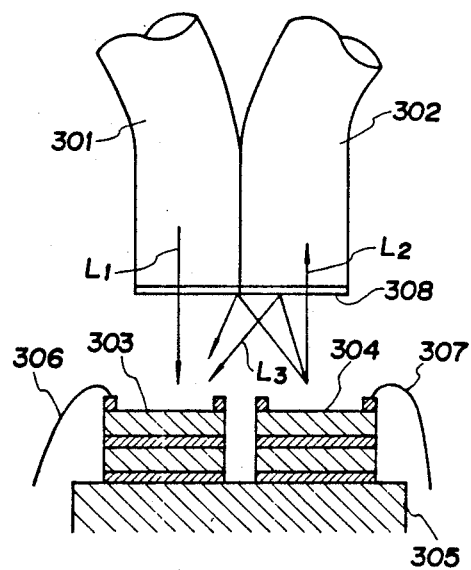
FIG. 17 is a view showing a fourth embodiment of this invention.

FIG. 17 is a view showing a fourth embodiment of this invention.

The numerals 301, 302 are a pair of optical fibers with one optical fiber 301 for input light while the other optical fiber 302 is for output light. The numeral 303 is a light receiving element, for instance, an NPN phototransistor, and the numeral 304 is a light emitting element, for instance, a light emitting diode. These are mounted adjacent on the same stem 305 as a hybrid element. The numerals 306, 307 are bonding wires. The numeral 308 is a filter film, provided by a coating or the like to end face sides of the optical fibers 301, 302 to pass a spectrum of the center wave length of the output lights from the light emitting diode 304 and reflect a spectrum to the light receiving element 303.

Input light L1 from the light input optical fiber 301 is incident to the phototransistor 303. Most light L2 from the light emitting diode 304 is passed to the output light optical fiber 302 and emitted to the outside, but a part L3 of light from the light emitting diode 304 is reflected with a part of a luminous spectrum by the filter film 308, and incident to the phototransistor 303.

Figure 18:
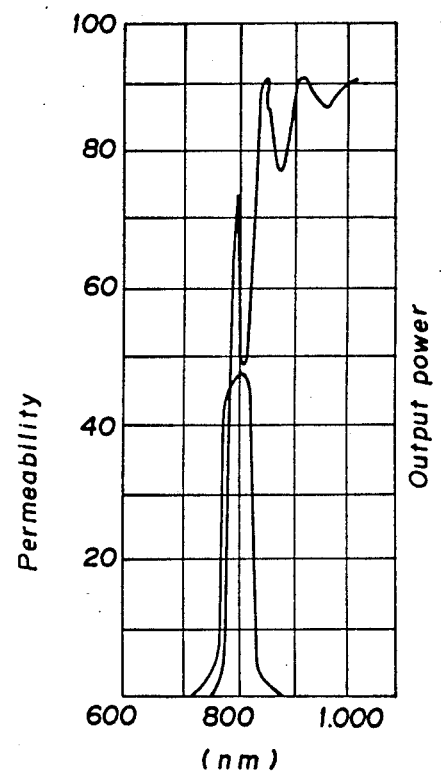
FIG. 18 is a curve showing the permeability characteristic of a filter film and the light emitting spectrum of the light emitting diode in said light relay of FIG. 17.

FIG. 18 shows a typical filter characteristic of luminous spectrum of the light emitting diode 304 and the filter film 308. As shown in the Fig., the luminous center wave length of the light emitting diode 304 is set to within the passing range of said filter film 302, and a part of a luminous spectrum of the light emitting diode 304 is set within a reflection range.

Figure 19:
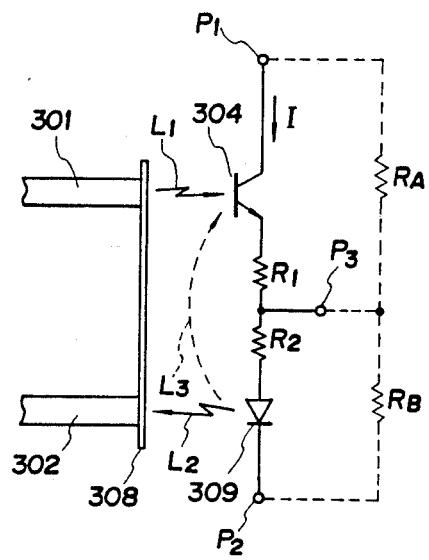
FIG. 19 is an equivalent circuit diagram of said light relay of FIG. 17.

An equivalent circuit of the above is as shown in FIG. 19. Operation of the above constitution will be described on the basis of this circuit.

Figure 20:
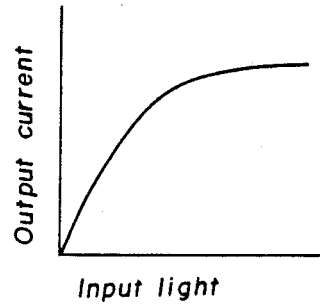
FIGS. 20(A), (B) are diagrams respectively for the light input waveform and received light output waveform in said light relay of FIG. 17.
Figure 20:
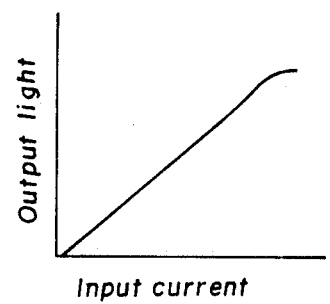

Driving voltage is applied between terminals $P_1$-$P_2$, and external resistors $R_A$, $R_B$ with a certain value are connected respectively between terminals $P_1$-$P_3$ and terminals $P_3$-$P_2$. Further resistors $R_1$, $R_2$ are connected respectively between an emitter of the phototransistor 303 and the terminal $P_3$ and the terminal $P_3$ and an anode of the light emitting diode 304. The input light-output current characteristic of the phototransistor 303 and input current-output light characteristic of the light emitting diode 304 are as shown respectively in FIG. 20(A) and FIG. 20(B). If the resistance values of resistors $R_A aR$, $R_B aR$ are set at a suitable value, the relation of the output light of the optical fiber 302 to input light of the optical fiber 301 has been experimentally proven to provide threshold level and hysteresis characteristics as shown in FIG. 21.

Firstly, if light incident from the optical fiber 301 increases, current I increases in accordance therewith. The increase of the output currentI increases output of the light emitting diode 304, and this output light is partially reflected by the filter film 308 of the end face of the optical fiber and again incident on the phototransistor 303. A positive feedback loop rapidly increases output light of the light emitting diode 304, to provide a threshold level characteristic. As above the opposite happens when current decreases.

FIG. 22 shows the light input waveform and light output waveform in optical fiber transmission as above. As understood from the Fig., amplification of light can be achieved by a small number of circuit parts. Simultaneously delay depends only upon the response speed of both elements of the phototransistor 303 and the light emitting diode 304.

In the above fourth embodiment, through a phototransistor is used as the light receiving element, other elements can be substituted. Further, the filter film 308 is sufficient if only provided to a side of the fiber 302.

As many apparently widely different embodiments of the present invention may be made without departing from the spirit and scope thereof, it is to be understood that the invention is not limited to the specific embodiments thereof except as defined in the appended claims.

What is claimed is:

1. A light signal binary device comprising:
   an input optical fiber for transmitting an input light signal;
   light receiving means for receiving said input light signal and converting said input light signal into an electric signal;
   light emitting means for receiving said electric signal and converting said electric signal into an output light signal;
   an output optical fiber having an open end for receiving and transmitting said output light signal; and
   a partially reflecting film on said open end of said output optical fiber for reflecting part of said output light signal to said light receiving means as positive optical feedback.

2. A device as in claim 1 wherein said film is a polarizing film.

3. A device as in claim 2 wherein said film is formed of a layer of ZnS, a layer of cryolite and a layer of ZnS.

4. A device as in claim 1 wherein said film is a filter for reflecting light within a predetermined spectrum to said light receiving means.

5. A device as in claim 1 wherein said output light signal has hysteresis.

* * * * *